United States Patent
Kim

(10) Patent No.: US 7,804,727 B2
(45) Date of Patent: Sep. 28, 2010

(54) SEMICONDUCTOR DEVICE HAVING MULTIPLE I/O MODES

(75) Inventor: Kwan-Dong Kim, Kyoungki-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 153 days.

(21) Appl. No.: 12/164,155

(22) Filed: Jun. 30, 2008

(65) Prior Publication Data

US 2009/0273985 A1    Nov. 5, 2009

(30) Foreign Application Priority Data

Apr. 30, 2008   (KR) .................. 10-2008-0040344

(51) Int. Cl.
*G11C 7/00* (2006.01)
(52) U.S. Cl. .................. 365/193; 365/194; 365/195
(58) Field of Classification Search ............. 365/193, 365/194, 195
See application file for complete search history.

(56) References Cited

U.S. PATENT DOCUMENTS

| | | | | |
|---|---|---|---|---|
| 5,410,670 A | * | 4/1995 | Hansen et al. | 711/169 |
| 6,622,256 B1 | * | 9/2003 | Dabral et al. | 713/600 |
| 7,237,136 B2 | * | 6/2007 | Li et al. | 713/401 |
| 2007/0186072 A1 | * | 8/2007 | Woo | 711/167 |
| 2007/0201286 A1 | * | 8/2007 | Oh | 365/193 |

FOREIGN PATENT DOCUMENTS

| | | |
|---|---|---|
| JP | 2005-243373 | 3/2007 |
| JP | 2007-058990 | 3/2007 |

OTHER PUBLICATIONS

Notice of Preliminary Rejection issued from Korean Intellectual Property Office on Oct. 20, 2009.
Notice of Allowance issued from Korean Intellectual Property Office on Jan. 28, 2010.

* cited by examiner

*Primary Examiner*—Son Dinh
*Assistant Examiner*—Nam Nguyen
(74) *Attorney, Agent, or Firm*—IP & T Law Firm PLC

(57) ABSTRACT

Semiconductor device having multiple I/O modes. The device includes a data buffer configured to receive data; a strobe input buffer configured to receive a data strobe signal, a phase controller configured to shift a phase of the data strobe signal by different numbers of degrees, including 0 degrees, according to input modes and a data detector configured to detect the data in response to the data strobe signal output from the phase controller.

14 Claims, 6 Drawing Sheets

SEMICONDUCTOR DEVICE HAVING MULTIPLE I/O MODES

CROSS-REFERENCE TO RELATED APPLICATION

The present invention claims priority of Korean patent application number 2008-0040344, filed on Apr. 30, 2008, which is incorporated by reference in its entirety.

BACKGROUND OF THE INVENTION

The present invention relates to a semiconductor device, and more particularly, to a semiconductor device, which is capable of exchanging data and a strobe signal with other devices in multiple I/O modes.

In order for high-speed data exchange between semiconductor chips, a strobe signal for strobing the data is used to correctly detect data. Accordingly, when exchanging data between the semiconductor chips at high speed, the semiconductor chips exchange the strobe signal as well as the data.

For example, when a synchronous dynamic random access memory (SDRAM), one of semiconductor memory devices, exchanges data (DQ) with a chipset (also called a memory controller), the SDRAM exchanges a data strobe signal (DQS) as well as the data.

FIG. 1 illustrates a clocking scheme to receive data DQ and a data strobe signal DQS in a receiver circuit of a semiconductor memory device (e.g., a double data rate (DDR) SDRAM).

The upper side of FIG. 1 illustrates the phase relationship between the data DQ and the data strobe signal DQS input from a chipset to the semiconductor memory device. As illustrated in FIG. 1, the data DQ and the data strobe signal DQS input from the chipset have a phase difference of 90 degrees. That is, the rising edges and falling edges of the data strobe signal DQS are aligned in the center of the data DQ.

Both the data DQ input to a data buffer 110 and the data strobe signal DQS input to a strobe input buffer 120 are output to a data detector 130. The data detector 130 may be implemented with a latch circuit. The data detector 130 latches the data DQ using the data strobe signal DQS aligned in the center of the data DQ to thereby allow the semiconductor memory device to correctly detect the data DQ.

Although not illustrated in FIG. 1, a delay line may be provided between the data buffer 110 and the data detector 130 or between the strobe input buffer 120 and the data detector 130 in order to compensate a delay difference caused by a physical distance between the data buffer 110 and the strobe input buffer 120 or a physical distance between a plurality of data buffers 110. Herein, the semiconductor memory device generally has eight data channels or sixteen data channels.

That is, a circuit for compensating a delay difference inevitably caused by a physical distance difference between a plurality of pins may be provided between the blocks illustrated in FIG. 1.

Since the compensation of the delay difference can be easily carried out by those skilled in the art, detailed description thereof will be omitted.

FIG. 2 illustrates a scheme to receive data DQ and a data strobe signal DQS in a receiver circuit of the chipset.

The upper side of FIG. 2 illustrates the phase relationship between the data DQ and the data strobe signal DQS input from the semiconductor memory device to the chipset. As illustrated in FIG. 2, the data DQ and the data strobe signal DQS input from the semiconductor memory device have with a phase difference of 0 degrees. That is, the rising edges and falling edges of the data strobe signal DQS are aligned in data boundaries between previous data and next data.

The data strobe signal DQS input to a strobe input buffer 220 of the chipset is input in a shifter 240. The shifter 240 shifts a phase of the data strobe signal DQS by 90 degrees. A data detector 230 latches the data DQ from data buffer 210 using the phase-shifted data strobe signal, whose rising and falling edges are aligned in the center of the data DQ, to thereby allow the chipset to correctly detect the data DQ.

SUMMARY OF THE INVENTION

Embodiments of the present invention are directed to a semiconductor device capable of exchanging data and a data strobe signal with other devices in multiple I/O modes. Accordingly, the semiconductor memory device can be applied to a variety of systems.

In accordance with an aspect of the invention, a semiconductor device includes a data buffer configured to receive data, a strobe input buffer configured to receive a data strobe signal, a phase controller configured to shift a phase of the data strobe signal by different numbers of degrees, including 0 degrees, according to input modes and a data detector configured to detect the data in response to the data strobe signal output from the phase controller.

In accordance with another aspect of the invention, a semiconductor device includes an output driver configured to output data, a phase controller configured to delay a phase of a data strobe signal by different numbers of degrees, including 0 degrees, according to output modes and a strobe output buffer configured to output the data strobe signal output from the phase controller to the outside of a chip. In accordance with still another aspect of the invention, a semiconductor device includes an output driver configured to output data, a phase locked loop configured to output clocks having different phases, a selector configured to select one of the clocks as a data strobe signal and a strobe output buffer configured to output the selected data strobe signal to the outside of a chip.

In accordance with further aspect of the invention, a semiconductor device includes a data buffer configured to receive data, a strobe input buffer configured to receive an input data strobe signal, an input phase controller configured to shift a phase of the input data strobe signal by different numbers of degrees, including 0 degrees, according to input modes, and a data detector configured to detect the data in response to the input strobe signal output from the input phase controller. An output driver is configured to output data, an output phase controller is configured to delay a phase of an output data strobe signal by different phases, including 0 degrees, according to output modes. A strobe output buffer is configured to output the output data strobe signal output from the output phase controller to the outside of a chip.

In accordance with another aspect of the invention, a semiconductor device includes a data buffer configured to receive data, a strobe input buffer configured to receive an input data strobe signal, an input phase controller configured to shift a phase of the input data strobe signal by different numbers of degrees, including 0 degrees, according to input modes, a data detector configured to detect the data in response to the input data strobe signal output from the input phase controller, an output driver configured to output data, and a phase locked loop configured to output clocks having different phases. A selector is configured to select one of the clocks as a data strobe signal according to output modes and a strobe output buffer is configured to output the selected data strobe signal to the outside of a chip.

DESCRIPTION OF SPECIFIC EMBODIMENTS

Hereinafter, a semiconductor device having multiple I/O modes in accordance with the present invention will be described in detail with reference to the accompanying drawings.

Figure 3:
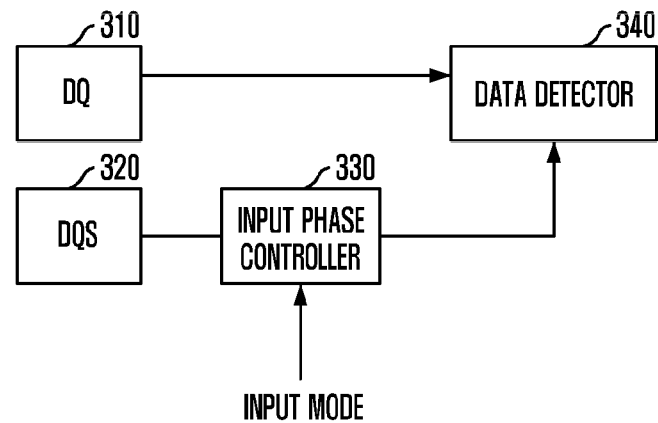
FIG. 3 is a block diagram illustrating a receiver circuit of a semiconductor memory device, which receives data (DQ) and a data strobe signal (DQS) in accordance with an embodiment of the present invention.

FIG. 3 is a block diagram illustrating a receiver circuit of a semiconductor memory device, which receives data (DQ) and a data strobe signal (DQS) in accordance with an embodiment of the invention.

Referring to FIG. 3, the semiconductor device supporting multiple input modes in accordance with the embodiment of the invention includes a data buffer 310, a strobe input buffer 320, a input phase controller 330, and a data detector 340. The data buffer 310 receives data DQ, and the strobe input buffer 320 receives the data strobe signal DQS. The input phase controller 330 shifts a phase of the data strobe signal DQS by different numbers of degrees, including 0 degrees, according to input modes. The data detector 340 detects data in response to the strobe signal output from the input phase controller 330.

The input phase controller 330 shifts the phase of the data strobe signal DQS by a predetermined number of degrees according to the input modes, and transfers the phase-shifted data strobe signal DQS to the data detector 340. For example, the input phase controller 330 shifts the phase of the data strobe signal DQS by 0 degrees in a first input mode, that is, without shift, and shifts the data strobe signal DQS by 90 degrees in a second input mode.

As described in the section entitled "BACKGROUND OF THE INVENTION", it is assumed that the data DQ and the data strobe signal DQS must have 90-degree phase difference in order for enabling the data detector 340 to correctly detect the data DQ. When the data DQ and the data strobe signal DQS input from the outside have 0-degree phase difference, the input phase controller 330 switches to the second input mode to shift the phase of the data strobe signal DQS by 90 degrees, and transfers the phase-shifted data strobe signal DQS to the data detector 340. Accordingly, the data detector 340 can correctly detect or latch the data. On the other hand, when the data DQ and the data strobe signal DQS input from the outside have 90-degree phase difference, the input phase controller 330 switches to the first input mode to transfer the data strobe signal DQS to the data detector 340 without phase shift. Therefore, the data detector 340 can correctly detect the data DQ.

The input phase controller 330 variably shifts the data strobe signal DQS according to the input modes. Accordingly, the data DQ can be correctly detected, regardless of the phase difference between the data DQ and the data strobe signal DQS input from the outside. That is, the semiconductor memory device in accordance with the invention can cope with various regulations on the phase difference between the data DQ and the data strobe signal DQS, for example, 90 degrees, 0 degrees, or 30 degrees. Therefore, the semiconductor device in accordance with the invention can be easily applied to more various systems than the conventional semiconductor device.

The input mode may be determined by external signals or a combination thereof. For example, the input mode may be indicated by a signal that has a logic value determined by the combination of a command CMD and an address ADD and set in a mode register set (MRS).

Moreover, the input mode may be determined by internal signals, or may be designed to be set according to the cutting of an internal fuse circuit.

Figure 4:
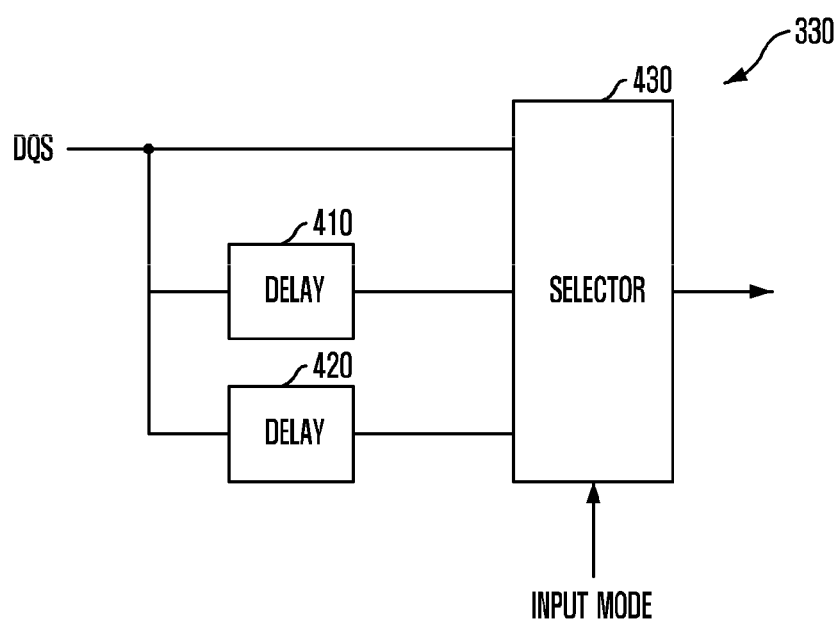
FIG. 4 is a block diagram of a phase controller (330) of FIG. 3.

FIG. 4 is a block diagram of the input phase controller 330 of FIG. 3.

Referring to FIG. 4, the input phase controller 330 includes one or more delays 410 and 420 for delaying the phase of the data strobe signal DQS by a predetermined number of degrees, and a selector 430 for selecting the output signals of the delays 410 and 420 or the data strobe signal DQS as it is and transferring the selected signal to the data detector 340.

The number of the delays 410 and 420 may be determined by the number of input modes supported by the input phase controller 330. It is assumed that the input modes include a first input mode in which the data DQ and the data strobe signal DQS have 0-degree phase difference, a second input mode in which the data DQ and the data strobe signal DQS have 30-degree phase difference, and a third input mode in which the data DQ and the data strobe signal DQS have 90-degree phase difference. In this case, the delay 410 delays the phase of the data strobe signal DQS by 90 degrees in order to support the first input mode and the delay 420 delays the phase of the data strobe signal DQS by 60 degrees in order to support the second input mode. On the other hand, a separate delay for supporting the third input mode is not required because the data strobe signal DQS is used without delaying its phase in the third input mode.

In the above-described assumption, the selector 430 selects the output signal of the delay 410 in the first input mode, and selects the output signal of the delay 420 in the second input mode. Furthermore, the selector 430 selects the data strobe signal DQS itself in the third input mode.

The delays 410 and 420 may use a control voltage VCTRL of a phase locked loop (PLL) in order to exactly delay the phase of the data strobe signal DQS by 90 degrees or 60 degrees. The PLL will be described below for explanation of the control voltage VCTRL.

Figure 1:
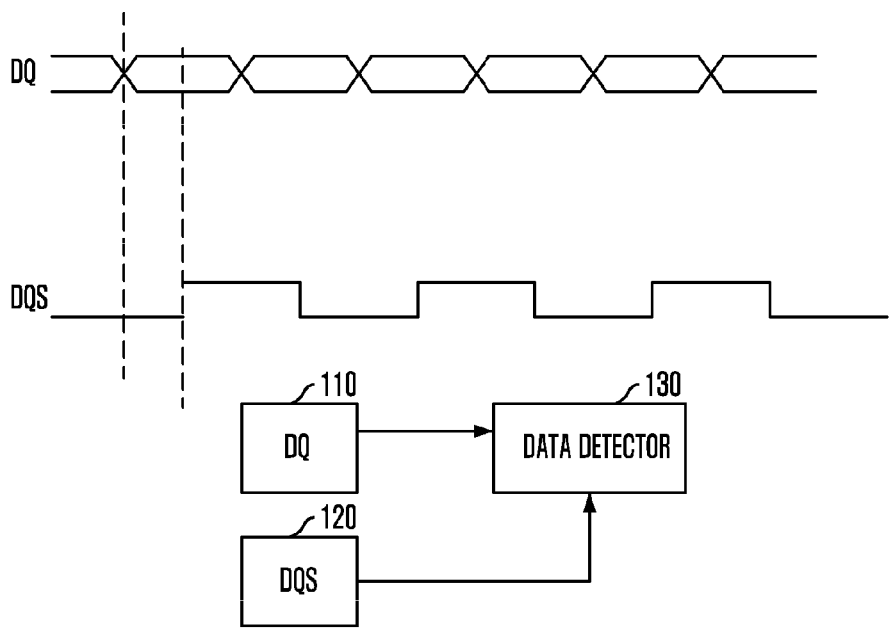
FIG. 1 illustrates a clocking scheme to receive data (DQ) and a data strobe signal (DQS) in a receiver circuit of a semiconductor memory device (e.g., DDR SDRAM).
Figure 2:
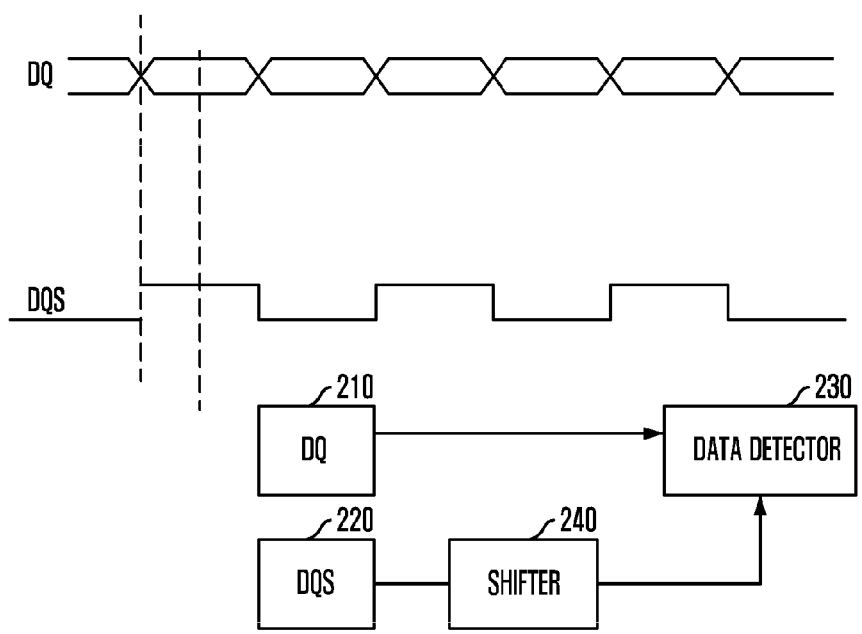
FIG. 2 illustrates a scheme to receive data (DQ) and a data strobe signal (DQS) in a receiver circuit of a chipset.

The delays 410 and 420 are separately illustrated in FIG. 1. This illustration is only for conceptive separation because the shift degrees of the delays 410 and 420 are different from each other. That is, the delays 410 and 420 may be implemented in a single chip, which will be described later in more detail.

Figure 5:
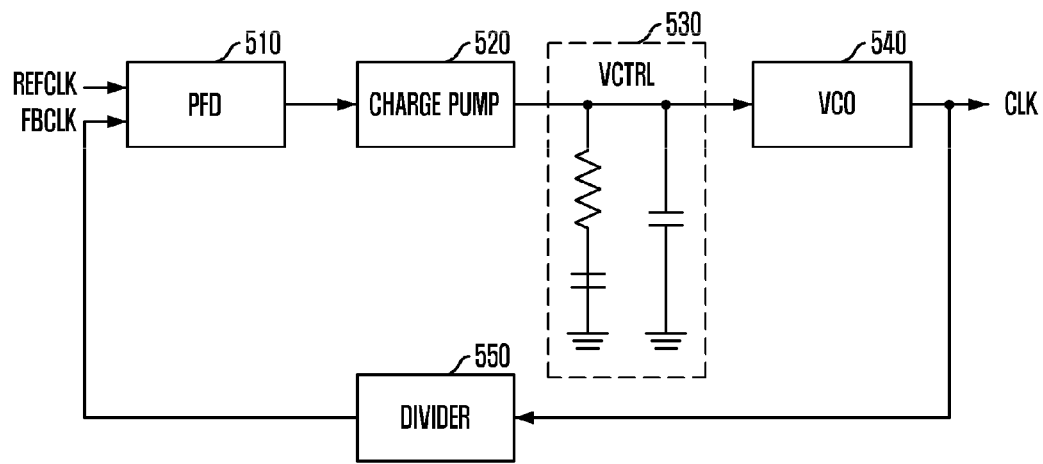
FIG. 5 is a block diagram of a phase locked loop (PLL).

FIG. 5 is a block diagram of the PLL.

As is well known, the PLL includes a phase frequency detector (PFD) 510, a charge pump 520, a loop filter 530, a voltage controlled oscillator (VCO) 540, and a divider 550.

The PFD 510 compares a reference clock REFCLK with a feedback clock FBCLK to output an up/down signal. The charge pump 520 outputs a charging current or a discharging current in response to the up/down signal. The loop filter 530 raises or lowers the level of the control voltage VCTRL in response to the charging current or the discharging output from the charge pump 520. The VCO 540 outputs a clock having a frequency varying with the level of the control voltage VCTRL. The divider 550 divides the output clock CLK of the VCO 540 to output the feedback clock FBCLK to the PFD 510.

Such a PLL generates a constant clock CLK having a fixed frequency and is widely used in various semiconductor devices operating based on the constant clock CLK. Accordingly, the PLL may also be used in semiconductor devices exchanging the data DQ using the data strobe signal DQS. The delays 410 and 420 use the control voltage VCTRL controlling the VCO 540 of the PLL. The VCO 540 of the PLL will be described below in detail.

Figure 6:
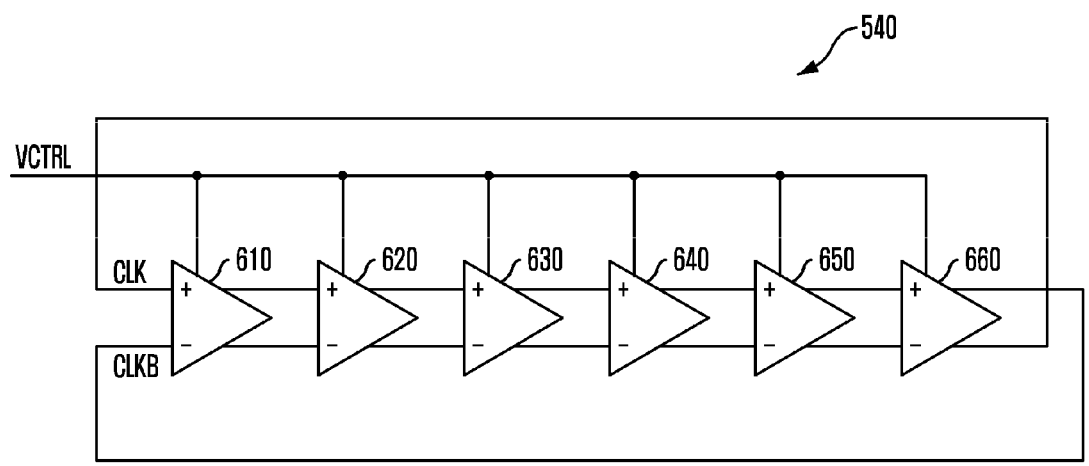
FIG. 6 is a circuit diagram of a voltage-controlled oscillator (VCO) (540) of FIG. 5.

FIG. 6 is a circuit diagram of the VCO 540 of FIG. 5.

Referring to FIG. 6, the VCO 540 includes a plurality of voltage controlled delay lines 610 to 660 connected in the form of a ring oscillator. Herein, the ring oscillator differentially delays signals to generate differential clocks CLK and CLKB.

The delay values of the voltage controlled delay lines 610 to 660 vary with the level of the control voltage VCTRL. The output signals of the last voltage controlled delay line 660 are fed back to the first voltage controlled delay line 610. At this point, two output terminals of the last voltage controlled delay line 660 are respectively connected to opposite terminals of the first voltage controlled delay line 610. That is, the clock CLK output from the last voltage controlled delay line 660 is fed back to the clock CLKB of the first voltage controlled delay line 610, and the clock CLKB output from the last voltage controlled delay line 660 is fed back to the clock CLK of the first voltage controlled delay line 610. Accordingly, the VCO 540 may generate the clocks CLK and CLKB having frequencies varying with the level of the control voltage VCTRL.

In case where the VCO 540 is configured with six voltage controlled delay lines 610 to 660 as illustrated in FIG. 6, a 30-degree phase difference occurs in each of the voltage controlled delay lines 610 to 660. That is, when the VCO 540 is configured with N voltage controlled delay lines, a (180/N)-degree phase difference occurs in each of the N voltage controlled delay lines.

The delays 410 and 420 may be configured using the principle that the respective voltage controlled delay lines 610 to 660 delay the phase of the clock CLK by a predetermined number of degrees. The structure of the delays 410 and 420 will be described below.

Figure 7:
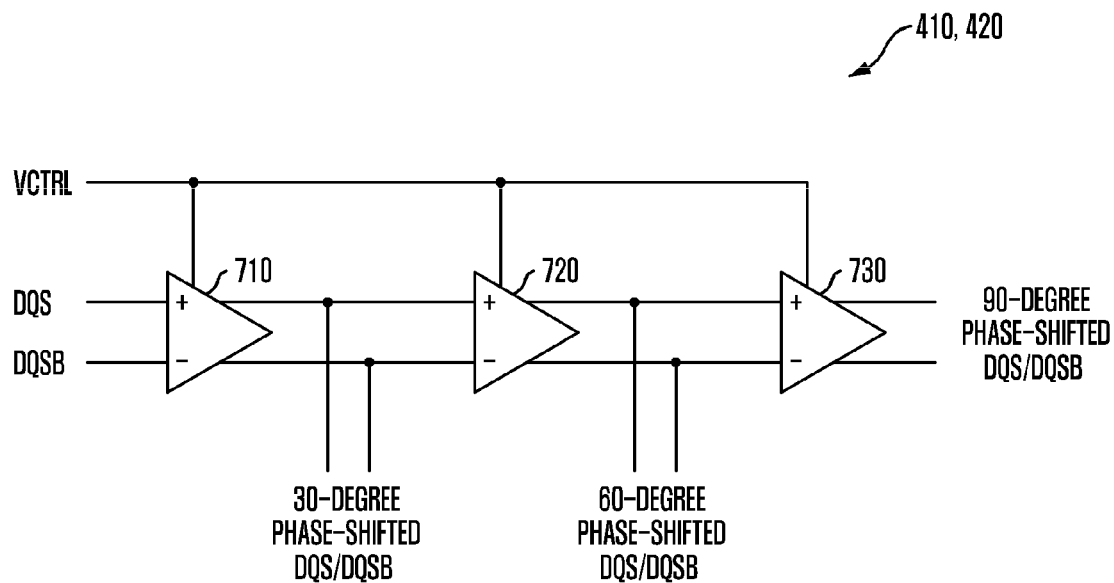
FIG. 7 is a circuit diagram of delays (410, 420) of FIG. 4.

FIG. 7 is a circuit diagram of the delays 410 and 420 of FIG. 4.

Referring to FIG. 7, the delays 410 and 420 may include one or more voltage controlled delay lines 710 to 730 connected in series. The voltage controlled delay lines 710 to 730 have the same structure as the voltage controlled delay lines 610 to 660 of the PLL and are also controlled by the control voltage VCTRL. Accordingly, each of the voltage controlled delay lines 710 to 730 delays the phases of the input signals DQS and DQSB by 30 degrees.

As described above, if the delay 410 intends to delay the phase of the data strobe signal DQS by 90 degrees, it may be configured with three voltage controlled delay lines 710 to 730. Also, if the delay 420 intends to delay the data strobe signal DQS by 60 degrees, it may be configured with two voltage controlled delay lines 710 and 720.

The delays 410 and 420 need not be separately configured. That is, the delays 410 and 420 delaying the data strobe signal DQS by 60 degrees and 90 degrees may be configured in a single circuit using the three voltage-controlled delay lines 710 to 730.

The delay 410 configured as above can delay the phases of the data strobe signals DQS and DQSB by exactly 60 degrees or 90 degrees. Furthermore, it is possible to configure a delay that delays the phase of the input signal by 30 degrees or 45 degrees by changing the number of the voltage controlled delay lines 610 to 660 of the VCO 540 and the number of the voltage controlled delay lines 710 to 730 of the delays 410 and 420.

In FIG. 7, the delays 410 and 420 delay the differential data strobe signals DQS and DQSB, and differentially output the delayed data strobe signals. However, the embodiment of FIG. 7 is merely exemplary, and it is apparent that the delays 410 and 420 can be configured to receive and delay the data strobe signal DQS itself and output the delayed data strobe signal.

Figure 8:
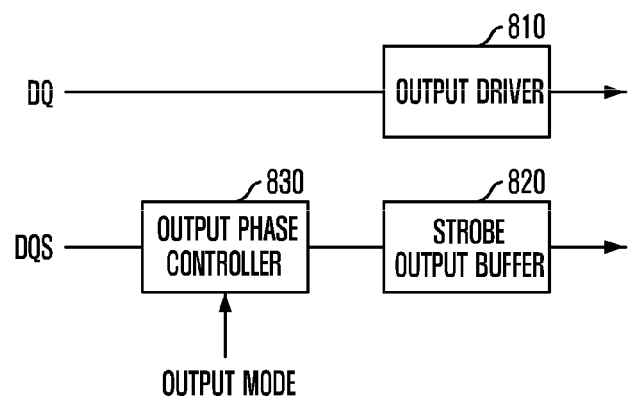
FIG. 8 is a block diagram of an output circuit for outputting the data (DQ) and the data strobe signal (DQS) in the semiconductor memory device in accordance with an embodiment of the invention.

FIG. 8 is a block diagram of an output circuit for outputting the data DQ and the data strobe signal DQS in the semiconductor memory device supporting multiple output modes in accordance with an embodiment of the invention.

Referring to FIG. 8, the semiconductor device supporting multiple output modes in accordance with the embodiment of the invention includes an output driver 810, a output phase controller 830, and a strobe output buffer 820. The output driver 810 outputs data DQ, and the output phase controller 830 delays the phase of the data strobe signal DQS by different numbers of degrees, including 0 degrees, according to the output modes. The strobe output buffer 820 outputs the data strobe signal DQS output from the output phase controller 830 to the outside of a chip.

The conventional semiconductor device outputs the data DQ and the data strobe signal DQS having a constant phase difference, for example, 0 degrees. Therefore, the conventional semiconductor device can exchange the data DQ only with devices (e.g., a chipset) configured to detect the data DQ and the data strobe signal DQS having 0-degree phase difference.

However, the semiconductor device in accordance with the embodiment of the invention can exchange the data DQ and the data strobe signal DQS with devices having different clocking schemes because, the output phase controller 830 changes the phase difference between the data DQ and the data strobe signal DQS according to the output modes.

Since the output phase controller 830 of FIG. 8 may be configured in the same structure as the input phase controller 330 of FIG. 3, detailed description thereof will be omitted.

The only difference between the two phase controllers 830 and 330 is that the output phase controller 830 controls the phase of the data strobe signal DQS to be output according to the output modes, whereas the input phase controller 330 controls the phase of the received data strobe signal DQS according to the input mode.

Figure 10:
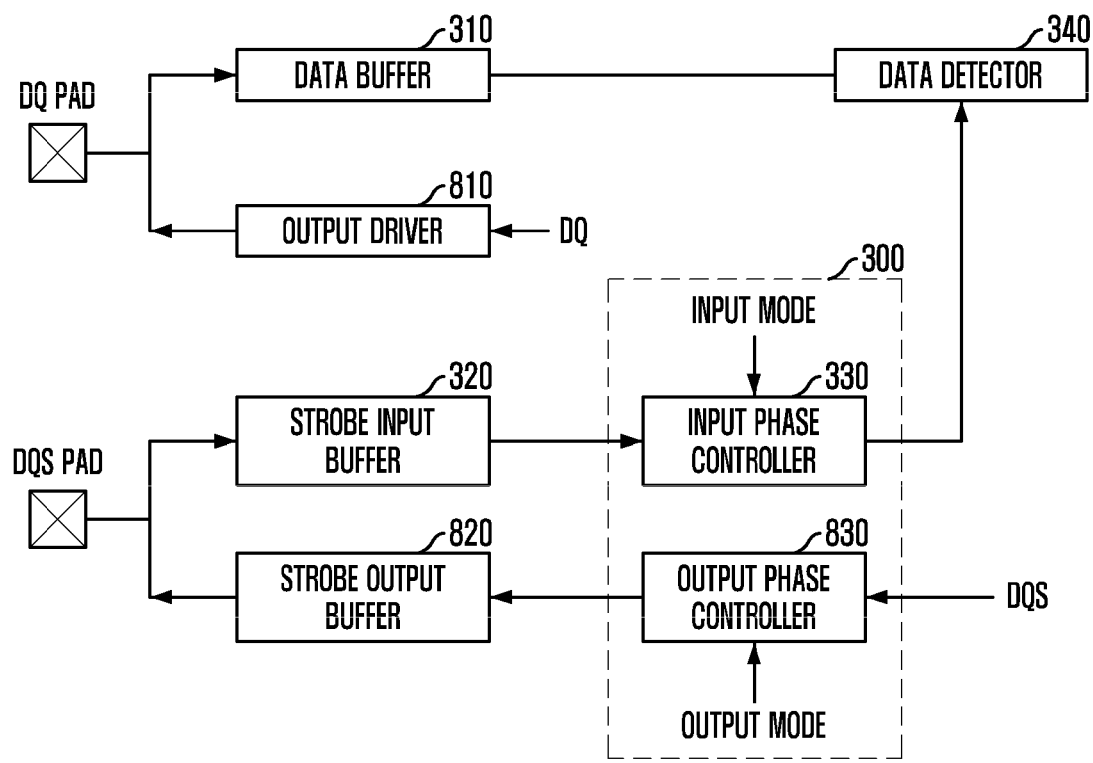
FIG. 10 is a block diagram illustrating a receiving/output circuit of a semiconductor memory device, which receives and outputs data (DQ) and a data strobe signal (DQS) in accordance with an embodiment of the present invention.

The semiconductor device supporting the multiple input modes have been described above with reference to FIGS. 3 to 7, and the semiconductor device supporting the multiple output modes have been described above with reference to FIG. 8. The two technologies described with reference to FIGS. 3 and 8 can be applied to a single semiconductor device at the same time as shown in FIG. 10, and can be applied separately. Referring to, FIG. 10, a phase controller 300 includes the input phase controller 330 and the output phase controller 830. The phase controller 300 configured to shift the phase of the input data strobe signal by different numbers of degrees, including 0 degrees, according to the input mode and to delay a phase of the output data strobe signal by different phase, including 0 degrees, according to the output mode.

Like the input mode, the output mode may be determined by the combination of external signals or internal signals.

Figure 9:
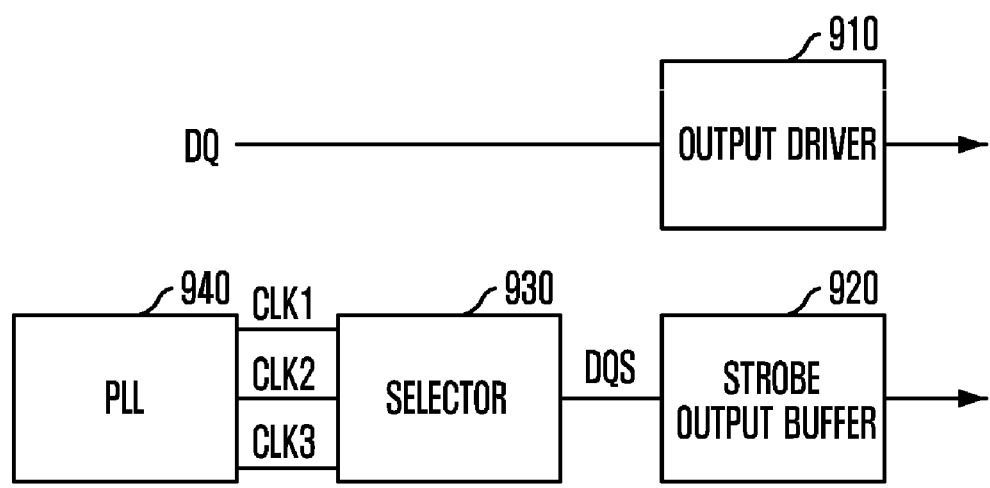
FIG. 9 is a block diagram of an output circuit for outputting the data (DQ) and the data strobe signal (DQS) in the semiconductor memory device in accordance with another embodiment of the invention.

FIG. 9 is a block diagram of an output circuit for outputting the data DQ and the data strobe signal DQS in the semiconductor memory device supporting multiple output modes in accordance with another embodiment of the invention.

Referring to FIG. 9, the semiconductor device supporting multiple output modes includes an output driver 910, a PLL 940, a selector 930, and a strobe output buffer 920. The output driver 910 outputs data, and the PLL 940 outputs clocks CLK1, CLK2 and CLK3 having different phases. The selector 930 selects one of the clocks CLK1, CLK2 and CLK3 as a data strobe signal DQS with respect to data according to the output modes. The strobe output buffer 920 outputs the selected data strobe signal DQS to the outside of a chip.

As described above, the PLL 940 outputs a stable clock with a constant frequency. Since the data strobe signal DQS is also a clock for strobing data, it can be generated using the PLL 940. A VCO of the PLL 940 is configured with a plurality of voltage controlled delay lines 610 to 660 connected in the form of a ring oscillator, as illustrated in FIG. 6. Furthermore, the clocks CLK1, CLK2 and CLK3 having the same frequency but the different phases are output through the output terminals of the controlled delay lines 610 to 660.

In accordance with the embodiment of the invention, the phase of the data strobe signal DQS is changed using the clocks CLK1, CLK2 and CLK3. If the data strobe signal DQS is generated using a clock whose phase leads that of the existing clock, which is used to generate the original data strobe signal DQS, by 30 degrees, the phase of the final data strobe signal DQS leads that of the existing data strobe signal by 30 degrees. Likewise, if the data strobe signal DQS is generated using a clock whose phase lags behind that of the existing clock by 90 degrees, the phase of the final data strobe signal DQS lags behind that of the existing data strobe signal by 90 degrees.

The clocks CLK1, CLK2 and CLK3 having the different phases are output from the PLL 940. The selector 930 selects one of the clocks CLK1, CLK2 and CLK3 having the different phases as the data strobe signal DQS according to the output modes. The data strobe signal DQS selected by the selector 930 is output through the strobe output buffer 920 to the outside of the chip.

The clock CLK output from the PLL 940 may pass through a variety of logic circuits until it is processed into the data strobe signal DQS. The invention is associated with how to shift the phase of the data strobe signal DQS to be output, not how to generate the data strobe signal DQS. Therefore, how to process the clock CLK to generate the data strobe signal DQS will be omitted. This is because it is apparent that, when the data strobe signal DQS is generated using the clock CLK, the phase of the data strobe signal DQS can be changed by changing the phase of the clock CLK which is a source for generating the data strobe signal DQS.

The phase shift of the clock CLK means the phase shift of the clock CLK to be used to generate the data strobe signal DQS, not the phase shift of the clock CLK used for the operation of the semiconductor memory device.

The semiconductor device in accordance with the invention can exchange the data and the strobe signal with other devices in multiple I/O modes. Accordingly, the semiconductor device in accordance with the invention can be applied to various systems.

While the invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
   a data buffer configured to receive data;
   a strobe input buffer configured to receive a data strobe signal;
   a phase controller configured to shift a phase of the data strobe signal by different numbers of degrees, including 0 degrees, according to input modes; and
   a data detector configured to detect the data in response to the data strobe signal output from the phase controller.

2. The semiconductor device as recited in claim 1, wherein the phase controller comprises one or more delays delaying the data strobe signal by a predetermined number of degrees.

3. The semiconductor device as recited in claim 2, wherein the one or more delays comprise one or more voltage controlled delay lines connected in series.

4. The semiconductor device as recited in claim 3, wherein the one or more voltage controlled delay lines comprise a phase locked loop further comprising a voltage controlled oscillator and the one or more voltage controlled delay lines are configured to be controlled by a control voltage controlling the voltage controlled oscillator.

5. The semiconductor device as recited in claim 1, wherein the input modes are determined by external signals or internal signals of the semiconductor device.

6. The semiconductor device as recited in claim 1, wherein the phase controller is configured to shift a phase of the data strobe signal by 0 degrees, 60 degrees, and 90 degrees according to the input modes.

7. A semiconductor device, comprising;
   an output driver configured to output data;
   a phase locked loop configured to output clocks having different phases;
   a selector configured to select one of the clocks as a data strobe signal; and
   a strobe output buffer configured to output the selected data strobe signal to an outside of a chip.

8. The semiconductor device as recited in claim 7, wherein the phase locked loop further comprises a voltage controlled oscillator and the clocks are output from different output terminals of the voltage controlled oscillator.

9. A semiconductor device, comprising;
   a data buffer configured to receive data;
   a strobe input buffer configured to receive an input data strobe signal;
   a phase controller configured to shift a phase of the input data strobe signal by different numbers of degrees, including 0 degrees, according to input modes or to delay a phase of an output data strobe signal by different phases, including 0 degrees, according to output modes;
   a data detector configured to detect the data in response to the input strobe signal output from the input phase controller;

an output driver configured to output data; and a strobe output buffer configured to output the output data strobe signal output from the phase controller to an outside of a chip.

10. The semiconductor device as recited in claim 9, wherein the input modes are determined by external signals or internal signals of the semiconductor device.

11. The semiconductor device as recited in claim 9, wherein the output modes are determined by external signals or internal signals of the semiconductor device.

12. A semiconductor device, comprising;

a data buffer configured to receive data;

a strobe input buffer configured to receive an input data strobe signal;

an input phase controller configured to shift a phase of the input data strobe signal by different numbers of degrees, including 0 degrees, according to input modes;

a data detector configured to detect the data in response to the input data strobe signal output from the input phase controller;

an output driver configured to output data;

a phase locked loop configured to output clocks having different phases;

a selector configured to select one of the clocks as a data strobe signal according to output modes; and a strobe output buffer configured to output the selected data strobe signal to an outside of a chip.

13. The semiconductor device as recited in claim 12, wherein the input modes are determined by external signals or internal signals of the semiconductor device.

14. The semiconductor device as recited in claim 12, wherein the output modes are determined by external signals or internal signals of the semiconductor device.

* * * * *